(12) United States Patent
McPherson et al.

(10) Patent No.: US 6,243,686 B1
(45) Date of Patent: *Jun. 5, 2001

(54) FLASH MEMORY CARD ADAPTER FOR STEREO SYSTEMS

(75) Inventors: Al McPherson, Burbank; Gregory Thagard, Encino, both of CA (US)

(73) Assignee: Warner Music Group, Inc., Olyphant, PA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/885,986

(22) Filed: Jun. 30, 1997

(51) Int. Cl.[7] .................................................. G10L 21/04
(52) U.S. Cl. ........................................... 704/500; 704/270
(58) Field of Search .............................. 369/2; 704/270, 704/278, 500, 501, 502, 503, 504, 200, 201

(56) References Cited

U.S. PATENT DOCUMENTS

| | | | |
|---|---|---|---|
| 4,734,897 | * 3/1988 | Schotz | 369/2 |
| 5,045,327 | * 9/1991 | Tarlow et al. | 704/270 |
| 5,491,774 | * 2/1996 | Norris et al. | 704/270 |
| 5,633,837 | * 5/1997 | Gantt | 369/7 |
| 5,654,942 | * 8/1997 | Akahane | 369/2 |
| 5,790,423 | * 8/1998 | Lau et al. | 364/514 |
| 5,815,426 | * 9/1998 | Jigour et al. | 365/51 |

* cited by examiner

*Primary Examiner*—Richemond Dorvil
(74) *Attorney, Agent, or Firm*—Gottlieb, Rackman & Reisman, P.C.

(57) ABSTRACT

The present invention provides an adapter for replaceable flash memory cards which can be used in existing stereo systems having a standard cassette player interface. The adapter is constructed and arranged to interface with a conventional stereo system so as to maintain full functionality of the included cassette player even when used with an adapter. Disposed within the housing is a flash card, or other solid state memory, which contains digital data. Audio data is retrieved form the card, decompressed, converted into corresponding analog signals and then fed to the play head of a standard cassette player. Circuits are provided to maintain substantially all the function of the cassette player, including fast forward and reverse.

54 Claims, 8 Drawing Sheets

FLASH MEMORY CARD ADAPTER FOR STEREO SYSTEMS

BACKGROUND OF THE INVENTION a. Field of the Invention

This invention pertains to an adapter for playing or recording musical selections and other audio programs stored in a digital medium such as a flash memory card using a standard stereo system, and more particularly to an adapter which uses the cassette mechanism of the stereo system as the interface for the digital medium.

b. Description of the Prior Art

Rapid advances in computer technology and related fields have resulted in very small energy efficient and inexpensive data storage media such as flash memory cards. While these media were primarily designed for use as memory for storing digital data, for example in laptop computers, digital cameras and other similar applications, they can also be used to store digital musical selections or other audio programs. For example, using MPEG2 or other data compression techniques, a musical selection of about 4 minutes can now be stored in a digital memory of 2 megabytes, and can be replayed in an acceptable manner. Moreover, flash memory cards are expected in the near future which have capacities of up to 16 megabytes or even more.

Hence, using these flash memory cards it is possible to distribute music to the general public using either standard venues such as record stores, mail order catalogs and so on, as well as non-conventional venues, such as the Internet.

A major problem in introducing a new medium such as flash cards is that they are incompatible with presently available stereo systems. The music-playing public is accustomed to playing music using standard stereo systems, i.e., systems which can play music originating either from live transmissions, such as AM or FM radio or TV, or from prerecorded media such as records, Cds or analog or digital cassettes. A typical audiophile has many prerecorded musical selections in one or more of these formats and naturally has a tendency to resist new types of prerecorded media which are not compatible.

OBJECTIVES AND SUMMARY OF THE INVENTION

It is an objective of the present invention to provide an adapter for replaceable flash memory cards which can be used in existing stereo systems having a cassette or same magnetic storage medium interface.

A further objective is to provide a cassette adapter which can be readily used by a consumer without the need of any special training or any additional expensive equipment.

A further objective is to provide an adapter which is constructed and arranged to interface with a conventional stereo system so as to maintain full functionality of the included cassette player even when used with an adapter.

Yet another objective is to provide a cassette adapter which includes a battery and a charging device.

Other objectives and advantages of the invention will become apparent form the following description. Briefly, an adapter constructed of accordance with this invention includes a housing similar to the housing of a standard cassette. Disposed within the housing is a flash card, or other solid state memory, which contains digital data.

Audio data is retrieved from the card, decompressed, converted into corresponding analog signals and then fed to the play head of a standard cassette player. Means are provided to maintain substantially all the functions of the cassette player, including fast forward, reverse, etc.

Preferably, an electric generator is also provided to recharge a battery which provides power to the adapter. Advantageously, the same generator may be used to apply a load on the cassette player's motor to simulate the end of a tape. Optionally, the output assembly of the adapter is modular and can be adapted to output signals to other devices, such as an earphone. A recording head may also be provided to record data in the flash memory.

DETAILED DESCRIPTION OF THE INVENTION

Figures 1, 1A:
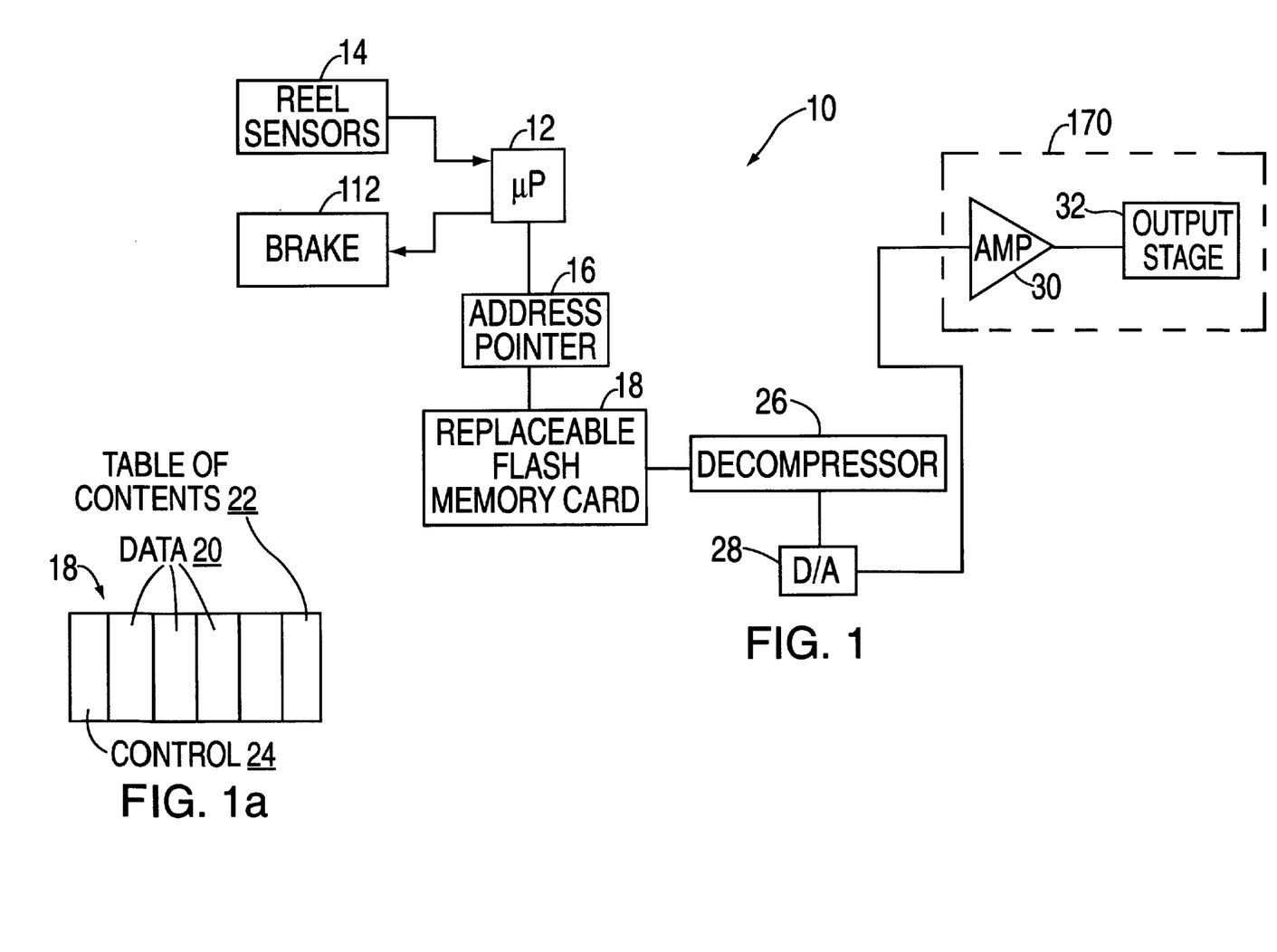
FIG. 1 shows a block diagram of the primary elements of the subject invention.
FIG. 1a shows details of how the information on a typical flash memory card may be formatted.

Referring now to FIG. 1, a cassette adapter 10 constructed in accordance with the invention includes a microprocessor 12 used to control operation of the adapter. The microprocessor receives information from reel sensors 14 used to monitor the motion of one or two dummy reels, as described more fully below. The adapter 10 further includes an address pointer 16 used to control the flow of information to and from a replaceable flash memory card 18.

As shown in more detail in FIG. 1a, card 18 is partitioned into several sections. These sections include a plurality of data sections 20 which hold the actual data for an audio program, for example, a plurality of musical selections. Card 18 further includes a table of contents 22 which is used to identify the addresses of each of the numerical selections. Finally, a section 24 may also be provided for control data to be used by the adapter 10 for various control functions.

As noted above, it is expected that the data corresponding to the audio selections is preferably compressed using for example an MPEG standard during recording to insure that maximum advantage is taken of the data storage capacity of card 18. As data is retrieved from card 18, it is first decompressed or expanded by decompressor 26. Next, a digital to analog conversion is performed by a D/A converter 28.

The converter 28 converts the digital signals from the replaceable card 18 into corresponding analog signals. An amplifier 30 is used to amplify the analog signals. Finally, an analog output stage 32 is used to transmit the analog signals to the cassette player section of a standard stereo system. Analog stage 32 also may include various other processing circuits that may be necessary to convert the analog signals into signals compatible with and expected by the cassette player of a standard stereo system, as discussed below.

Figure 2:
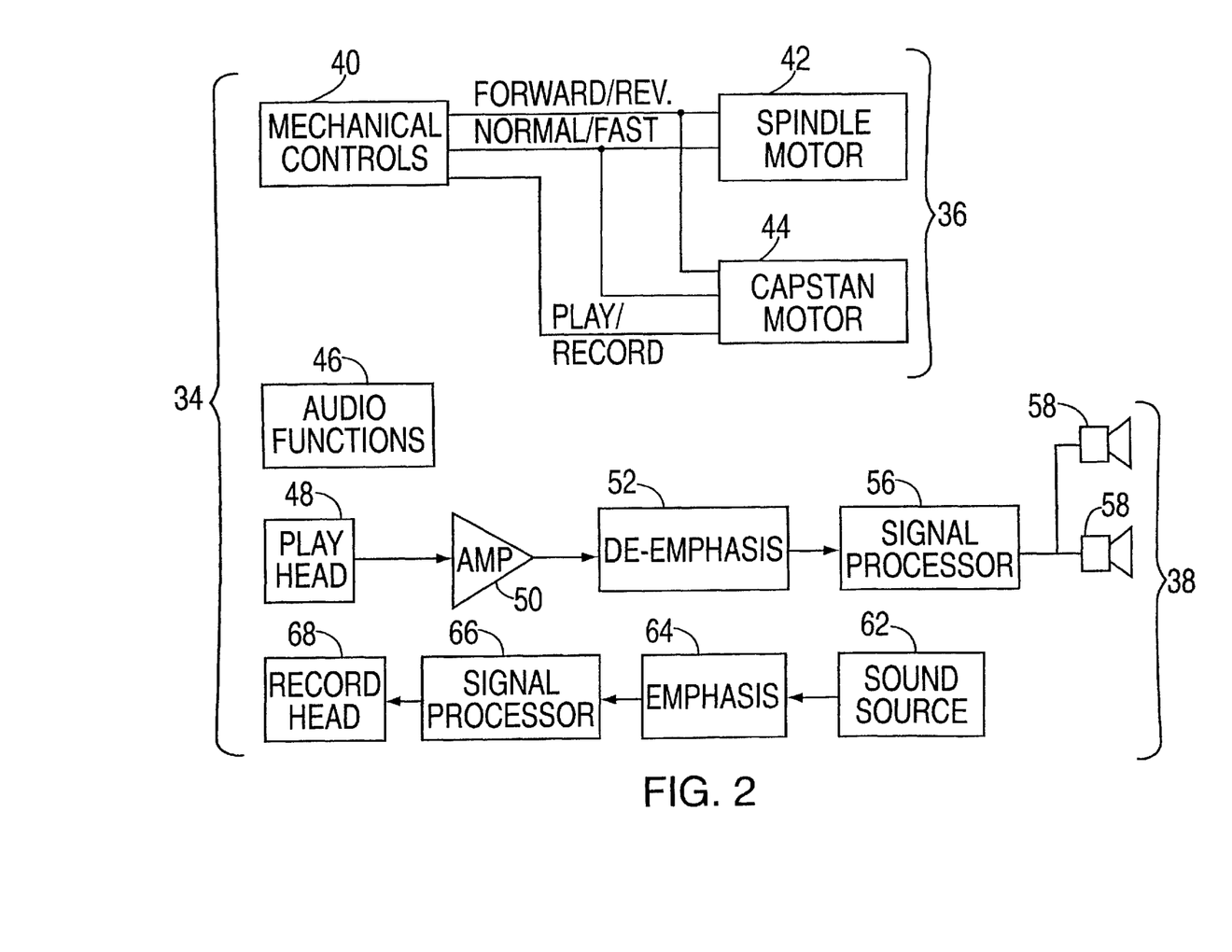
FIG. 2 shows a block diagram of a typical cassette player/recorder.

As shown in FIG. 2, a standard stereo system includes a tape cassette player 34 having a mechanical section 36 to handle the mechanical functions of the player, and an electrical section 38 to handle the signal processing. The mechanical section 36 includes a plurality of control switches or other similar control means 40 which are activated either by the user, or automatically, to perform functions normally associated with cassette players, such as play, record, fast forward, fast reverse, and so on. Section 36 further includes a spindle motor 42 and a capstan motor 44. It should be understood that motors 42 and 44 are shown for illustrative purposes and that in some players more than one motor may be used for the designated purpose. Moreover, other mechanical and electromechanical elements are also normally present in a cassette player which do not play a part in the present invention and hence are not shown.

The electrical section 38 includes audio function controls 46, a player head 48, an amplifier 50, a de-emphasis circuit 52, a signal processor circuit 56 and one or more speakers 58. If the player 34 is also a recorder, section 38 may further include a sound source 62, i.e. a microphone, a jack for inputting a signal to be recorded, a coupling to some other components of the system, such as a radio or CD player, and so on. The signals from sound source 62 go through an emphasis circuit 64 and a signal processor 66 to a record head 68. Again, only a single circuit is shown in FIG. 2, it being understood that for stereo and multi-channel systems two or more circuits may be used for each of described functions. The audio function control 46 controls the various circuits of section 38.

Normally, when the PLAY control (not shown) is activated, spindle motor 42 starts turning a spindle within a normal cassette and the capstan motor advances into the cassette to force the magnetic tape contained in the cassette to move in a predetermined direction at constant speed past the play head 48. The play head then reads the analog signals stored on the tape and transmits corresponding signals to the amplifier 50. The audio signals on a magnetic tape are quite noisy and in many instances may not be acceptable for a high fidelity musical selection. Therefore, over the years various scheme have been developed to eliminate or reduce noise, including, for example, emphasizing certain frequencies components. After amplification, the signals are passed through circuit 52 for de-emphasizing signals of certain frequency and generally to correct the signals for any processing effects that may have been added to eliminate noise. After circuit 52, the signals are fed to signal processor 56 which separates them into appropriate channels and feeds corresponding signals to the speakers 58. Volume control, and other adjustments requested by the user through the audio function control 46 may also be performed by processor 56.

The elements 62–68 reverse this process to allow sounds to be recorded on a magnetic tape.

In the present invention, since there is no magnetic tape, provisions are made to mimic all the standard functions performed by a standard cassette player. Therefore, when the adapter 10 is inserted into the standard cassette player, the player reproduces through the speakers 58 the musical selections stored digitally on card 18, with all or at least most of the functions of controls 40, 46 being operational.

Figure 3:
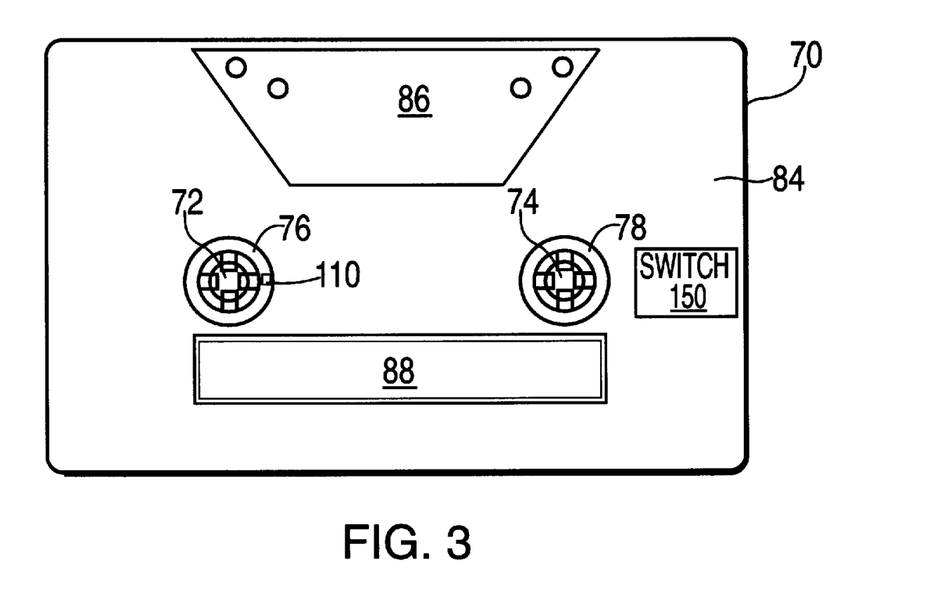
FIG. 3 shows a plan view of a cassette adapter constructed in accordance with this invention.
Figure 4:
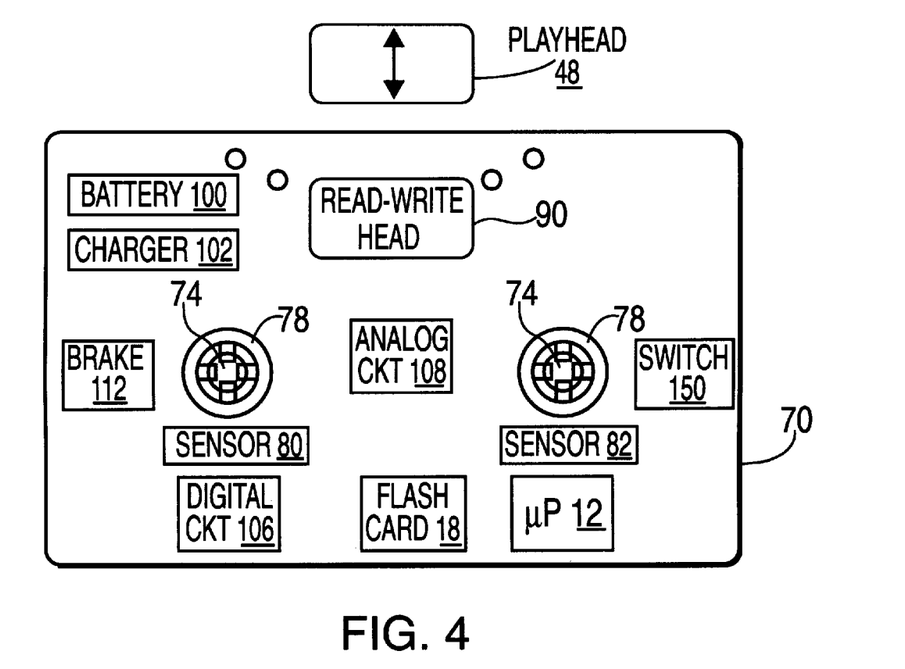
FIG. 4 shows a somewhat diagrammatic interior plan view of the cassette adapter in accordance with this invention.

Referring now to FIGS. 3 and 4, adapter 10 includes a housing 20 which is substantially identical to the housing of a standard cassette, and therefore is provided with two holes 72 and 74. Disposed inside housing 70 are two dummy reels 76, 78 mounted concentrically with holes 72 and 74, respectively. Reels 76 and 78 are dummy reels in the sense that they do not pay out or pick up a magnetic tape as is the case with standard cassettes. Associated with reels 76, 78 are sensors 80, 82, used to monitor the respective motions of the reels 76, 78 as described below.

On one surface of housing 70, such as top surface 84, there are provided two removable panels 86, 88. These panels provide access into the interior space of housing 70. Panel 88 is used to access the flash memory card 18, while panel 86 is used to replace a read/write head 90 described more fully below. In the simplest embodiment, head 90 includes the output stage 32.

Housing 70 further includes a battery 100, a battery charger 102, a digital circuit 106 and an analog circuit 108. The battery 100 provides power for the various electrical components contained within housing 70.

Figure 5:
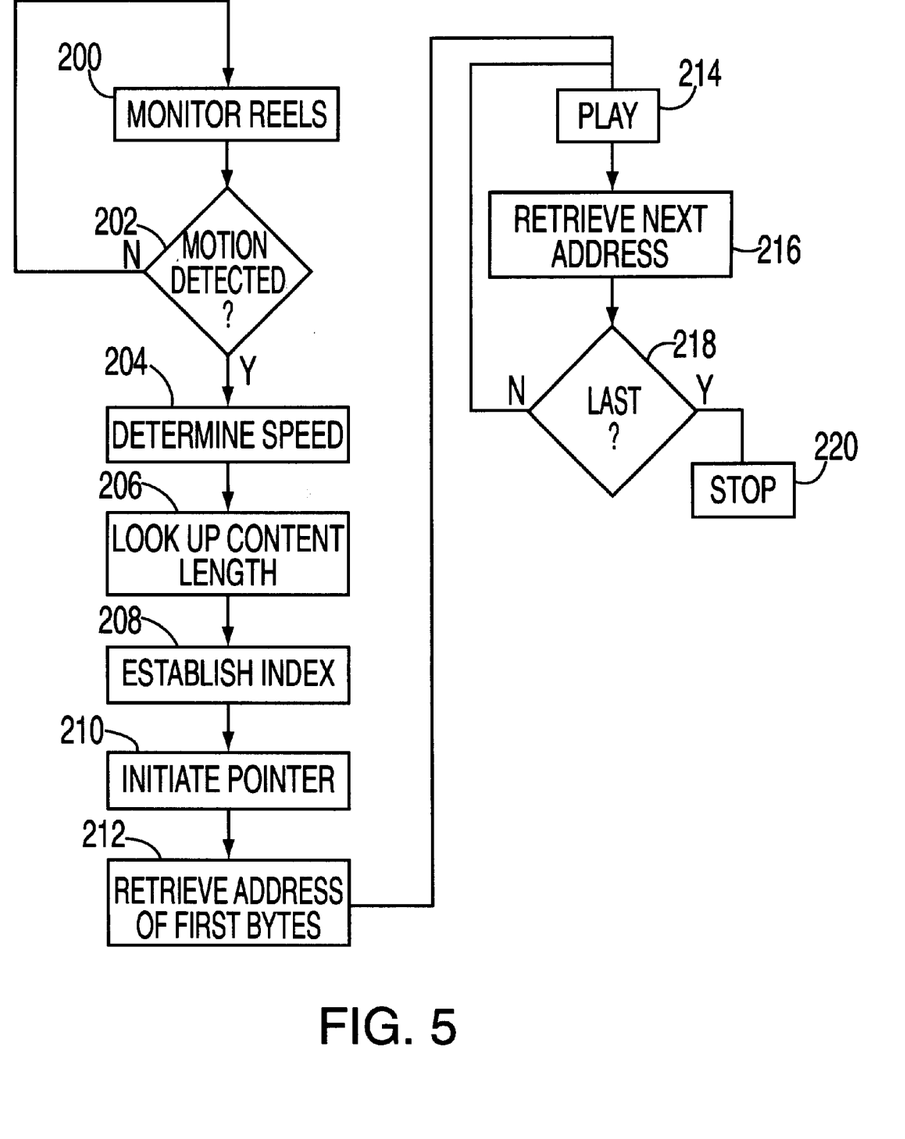
FIG. 5 shows a flow chart of the basic operation of the adapter of FIG. 1.

The operation of the adapter will now be described in conjunction with the flow charts of starting with FIG. 5.

First, the adapter 10 is inserted into the cassette player 34 so that the spindles(not shown) extend through the holes 72 and 74 and engage the reels 76 and 78. The sensors 80, 82 are used to determine the functions requested by the user. Initially, the spindles are idle and no function is required from the adapter. Accordingly the adapter 10 is idle.

At regular intervals, the microprocessor 12 queries the sensors to check if the reels have started moving (step 200). If movement is detected, in step 202, it is assumed that the user has pushed the PLAY control. Alternatively a separate sensor may be used to detect the play head 48, which is advanced toward the housing 70 by or in response to the activation of the PLAY button, as shown in FIG. 3.

Next, in step 204 the speed of rotation of the reel that is moving is measured. As previously mentioned, the card 18 includes a table of contents section which not only contains information on where each of the musical selections starts and ends, but also the total length or duration of the audio program of card 18. In step 206, this total length is retrieved or looked up, and used (step 208) in conjunction with the speed of the moving reel to establish an index number. This index number is used for fast forward and reverse functions as described below.

Next, the address pointer 16 is set to the address for the beginning of the first musical selection on card 18, as defined in the table of contents (step 210). In step 212, the first bytes of music at the first location are retrieved and played (step 214) as described above in conjunction with FIG. 1. As a result, the output stage 32 generates electromagnetic signals similar to the signals generated by a standard cassette.

Within the cassette player, the head 46 senses the signals from output stage 32 and operates just as it does with a normal cassette, to start playing the tape. As the first data bytes are being processed and played, the next group of bytes are retrieved in step 216 by address pointer 16 and converted on the fly to be played as described. In step 218 the table of contents is checked to detect if the current bytes are the last byte. If they are, then the play process is terminated after the last bytes are played (step 220) and a stop subroutine is initiated. Otherwise the process continues. Between each separate selection (assuming that the card 18 contains more than one) the microprocessor could insert an artificial gap of 1–3 seconds as is customary with standard tapes.

Volume and frequency adjustments are made by the user using the cassette player controls in accordance with standard operating functions as described.

Figure 6:
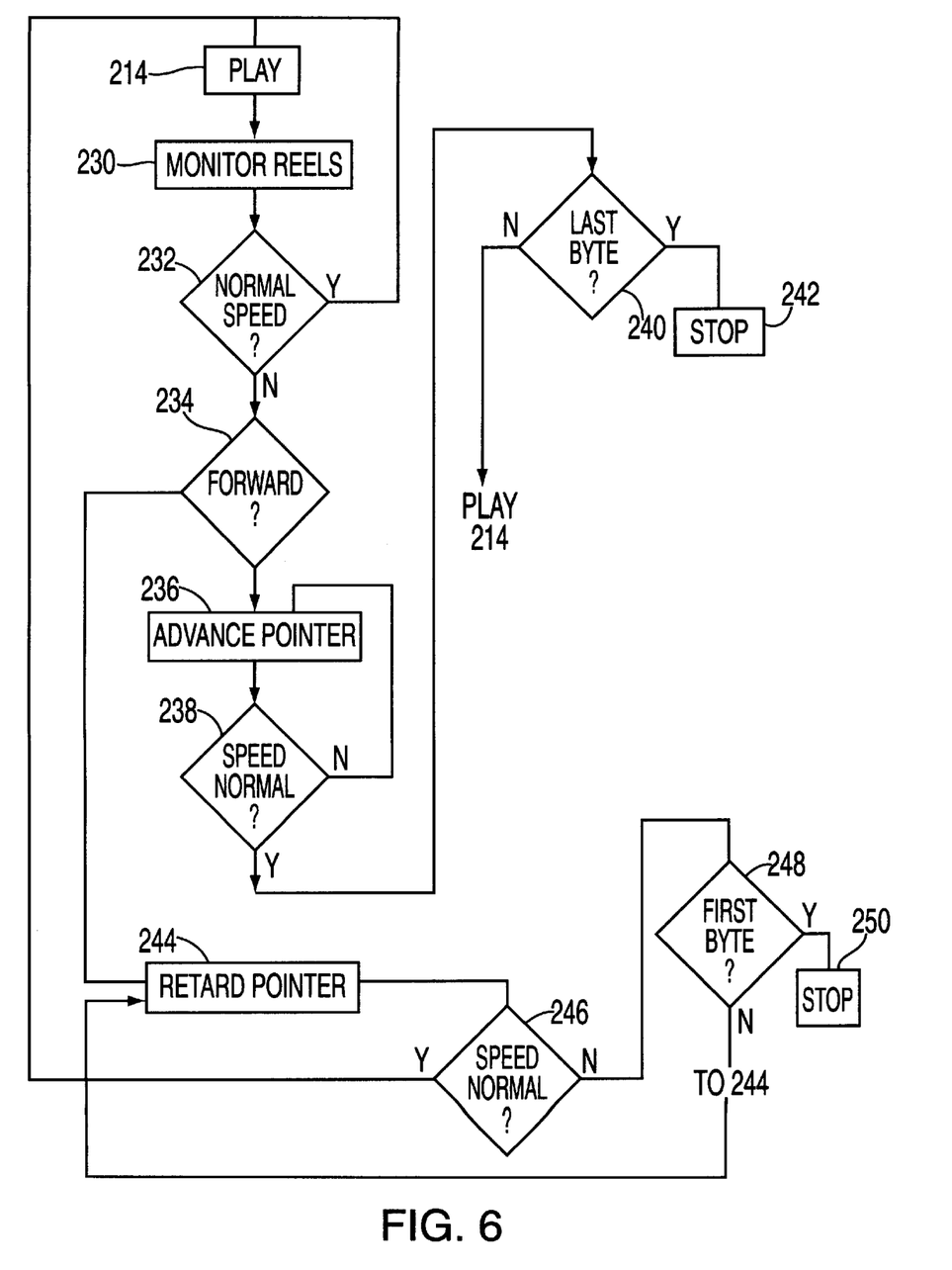
FIG. 6 shows a flow chart of a fast forward/reverse function.

The adapter is also designed to perform other standard functions. For example, FIG. 6 shows a flow chart for the fast forward and fast reverse functions. During normal play (step 214), the reels are monitored (step 230) with sensors 80, 82 to determine their direction of rotation and speed. (In most cassette players, only one of the reels is turned for play and fast forward, and the other reel is turned in the opposite direction for fast reverse). If the reels are turning at a normal speed (step 232), then normal play continues. If in step 232 a fast turning reel is detected then in step 234 a determination is made as to whether a fast forward or reverse function has been requested.

When fast forward is detected, in step 236 play is suspended and the pointer 16 is advanced. More particularly, the pointer is advanced at a rate proportional to the speed of rotation of the moving reel. For instance, if in step 204 (FIG. 5), a pulse is detected from reel 76 every four seconds, and in step 206 it is determined that the card 18 contains 1000 seconds of music, then in step 208 a maximum index of 1000/4=250 is established with each index number 1...250 corresponding timewise to a corresponding group of bytes. As normal PLAY proceeds, the index number is slowly incremented in step with the address pointer so that for each pulse from the sensor, 4 seconds of music are played. During fast forward the index is incremented faster in accordance with pulses from the sensor and the pointer is advanced at a faster rate from one group of bytes to the next, so that for every pulse, four seconds worth of bytes are skipped (step 236). At regular intervals the speed of the reel is sampled (step 238). If the reel slows down to normal speed, then normal play resumes at the last position of the pointer. If the reel continues turning fast, then the position of the pointer is checked against the table of contents to insure that the end of the recorded program has not been reached. If it has, then in step 242 the stop subroutine is initiated Otherwise, the pointer continues to advance.

If in step 234 a fast reverse (or rewind is detected) then in step 244 the pointer is retarded or decremented at a high rate in the same manner as it is incremented in step 236. In step 246 the reel speed is checked. If the reel speed has returned to normal, then normal play is resumed (step 214). If the speed remains high, then in step 248 the position of the pointer is checked to determine if the first bytes have been reached. If not then step 244 is continued. Otherwise the stop subroutine is initiated in step 250.

Power to the components of adapter 10 is primarily provided by the battery 100. While substantially no mechanical work is being performed within the adapter 10, and hence the battery 100 may last for a fairly long time, it is advantageous if a battery charger system 102 is provided within the adapter to thereby prolong the life of the battery almost indefinitely.

Figure 7:
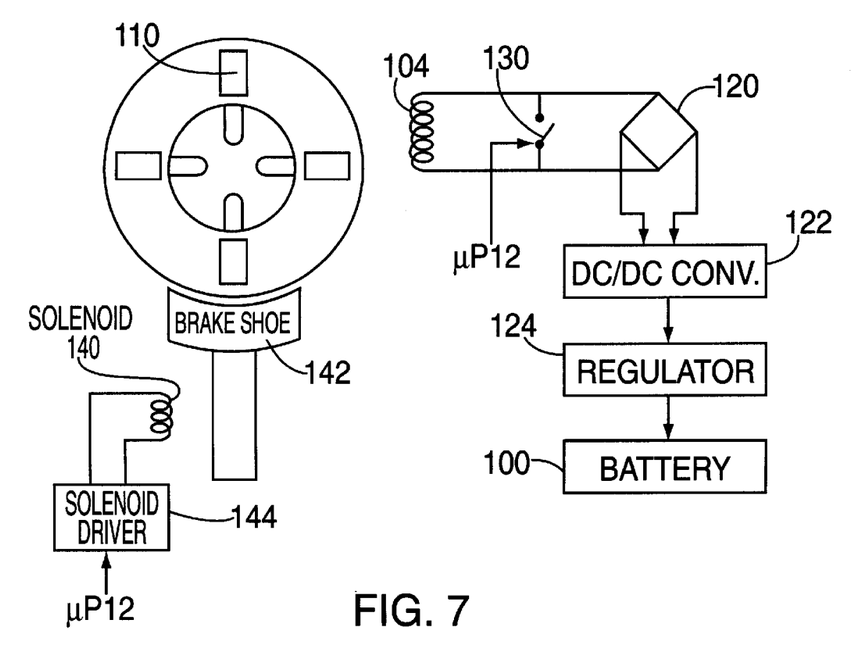
FIG. 7 shows a block diagram of a battery charger and brake assembly for the adapter of FIG. 1.

As shown in more detail in FIG. 7, for this purpose the battery charger 102 includes a generator coil 104 associated with one of the reels, i.e., reel 76. Moreover, reel 76 is provided with a plurality of permanent magnets 110 and generator coil 104 is positioned adjacent to reel 76 so that during PLAY or FAST FORWARD as the reel is turned by the spindle motor 42, an electric current is generated within the coil 104. This current is rectified by a full wave rectifier 120 and the rectified current is fed to a dc/dc converter 122 which converts the same to a voltage level compatible with battery 100. Finally, the output of the converter 122 is fed to a voltage regulator 124 which regulates the voltage from the converter 122 and then uses the same to charge battery 100. In most instances, only the reel associated with the forward motion of the tape in standard cassettes is driven and hence, a single coil 104 may be sufficient. However, if desired a second coil, rectifier and dc/dc converter may be provided (not shown) which are associated with the second reel 78. In this case the regulator 124 feeds to the battery 100 charging current generated by either reel 76 or reel 78.

Figure 8:
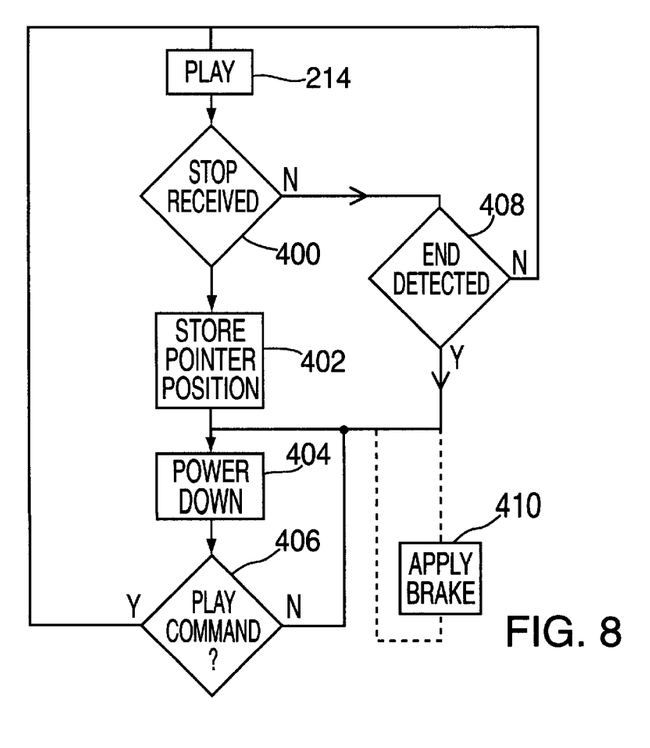
FIG. 8 shows a flow chart of a stop/power down subroutine.

As previously mentioned, one of the features that must be implemented is a STOP function. A STOP is required either when a user activates a corresponding pushbutton, or when an end of the program on a flash card is reached. The first event is relatively simple to implement since in standard cassette players, when the user pushes a STOP push button, the spindle and the capstan motors stop. Hence this event is easily identifiable by the sensors monitoring the motions of the reels 76, 78, and is handled as indicated in the flow chart of FIG. 8. In step 214, a normal play sequence takes place as described above. In step 400, a test is performed to detect a STOP command from the cassette player 34. When neither of the reels is moving, a STOP command may be assumed and the processor 12 can put the adapter 10 in a low-powered stand-down mode as follows. First, preferably, the current position of the pointer address 16 indicative of the last musical bytes played is retained or stored by the microprocessor 12 (step 402) so that when PLAY is resumed, the adapter can continue to play the current musical selection. Next, in step 404 the microprocessor orders a power-down sequence to conserve energy. In step 406 the reels are monitored for motion to detect a PLAY command. When such a command is detected the play mode is resumed (step 214) at the position where it was interrupted, as indicated by the address pointer 16.

The ends of the musical content of a given flash card are a little more difficult to handle because there is no direct communication between the adapter 10 (or the cassette) and the cassette player 39. The term "end" is used herein to refer to either the front and/or beginning of a program reached in response to a fast reverse or rewind operation, or the last portion of the content reached by a regular play or fast forward operation. In cheaper cassette players, there are no provisions for detecting the end of a tape. Instead, it is assumed that sooner or later the user will notice that the music is no longer playing and will press the STOP button. However, for the present invention, waiting for a STOP command is not very desirable because it wastes energy. Therefore, as shown in step 408 or FIG. 8, if a STOP is not received but an end is detected, i.e., the address pointer points to the beginning or end of the program, after a predetermined time the adapter 10 powers down(step 404).

In more advanced systems, the load on the spindle motor may be monitored by the cassette recorder 34 and if a sudden increase in the load is detected, a tape end (or tape jam) is assumed and an automatic STOP function is performed. In an alternate embodiment, the present invention simulates this function by applying a load or a 'brake' to the appropriate reel (step 410) as follows. Referring back to FIG. 7, a shunting electronic switch 130 is provided which, when closed, shunts the coil 104. This switch 130 is operated by the microprocessor 12. When a program end is detected in step 408, the microprocessor 12 issues a command to close switch 130. Switch 130 then shunts the coil 104 and puts a sudden, relatively large load on the spindle motor, similar to the load produced by the end of a standard tape. The cassette player interprets this as an end-of-tape event and generates an automatic STOP as discussed above.

An alternate means of providing a braking mechanism is also illustrated in FIG. 7, consisting of a solenoid 140, a brake shoe 142 and a solenoid driver 144. In this embodiment, when a program end is detected in step 408, the microprocessor 12 sends a command to driver 144. The driver 144, in response, activates the solenoid 140. The solenoid then forces the brake shoe 142 into functional contact with the reel 76. Thus when applied the brake shoe 142 effectively slows down or even stops the reel 76. This causes the load on the spindle motor to increase suddenly in the same manner as when a tape reaches its end.

The functions described so far mimic or duplicate standard functions associated with cassette players. However, since the adapter 10 contains more information than the simple magnetic tape in a standard cassette, the operation of the adapter may be modified to make use of this information and operate more efficiently. For example, frequently a user may want to skip a particular musical selection, or may want to replay a selection that has been played already. In most cassette players, he can accomplish this only by fast forwarding or reversing the tape by an arbitrary amount and then playing the tape at its new position. Most of the time, using this method results in either undershooting the desired selection so that the user hears either nothing because he has hit a gap between the selections, or a previous selection; or overshooting, as a result of which the user hears the middle of the selection he wanted. Thus, it takes several tries until the user finds the beginning of the denied selection.

More sophisticated cassette players exist which are able to detect the beginning and end of a musical selection from the silent gaps in between. In these players, when the user presses, for example, the fast forward button, the player uses the play head to monitor the tape until a gap is detected, the player stops, indicating that the next musical selection has been located. Of course, this feature is still time consuming, especially if the current musical selection is rather long. Moreover, very low volume, quiet passages in a musical selection, are frequently erroneously interpreted as gaps.

Figure 9:
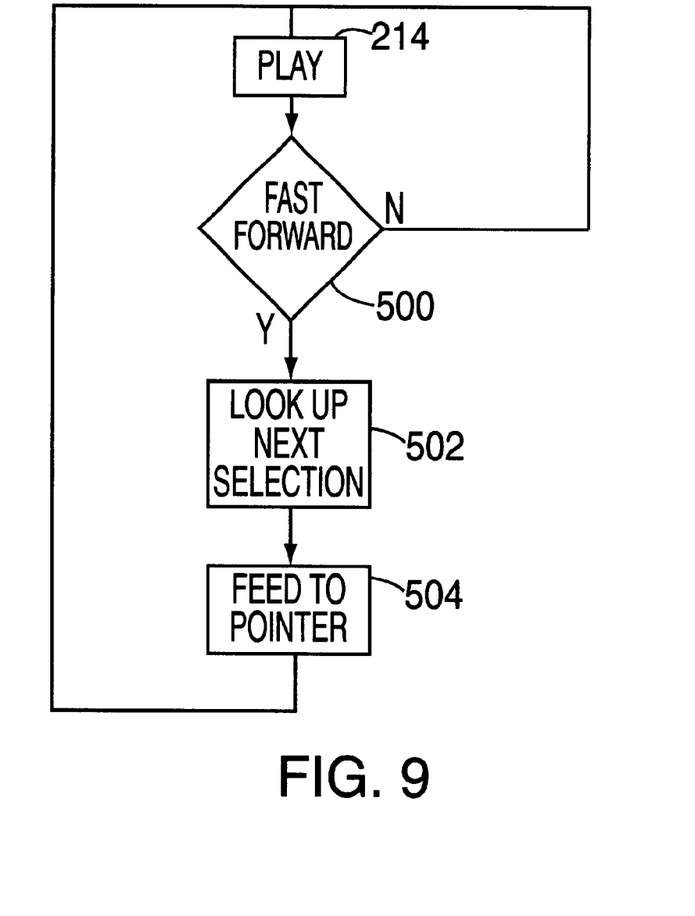
FIG. 9 shows a flow chart of an alternate fast forward/reverse function.

This problem is resolved in the present invention as follows. As previously mentioned, the beginning and end of each selection on flash card 18 are known from the table of contents (Section 24). Therefore the adapter can be programmed to take advantage of this information. Referring to FIG. 9, during normal play (Step 214), the reels are monitored as discussed above. If in step 500 a fast forward command is detected, then in step 502 the address of the beginning of the next musical selection is looked up in the table of contents. In step 504, this address is loaded into the address pointer 16. Play can resume then with the new selection. The same process may be used to return to a previous selection when a fast reverse is detected.

This mode of operation may be preprogrammed. Alternatively, a manual selection switch 150 may be provided on the housing 70 (FIG. 6) for selecting either the mode described by flow chart of FIG. 6 or the mode described by the flow chart of FIG. 8. Alternatively, this mode of operation may be a selectable parameter stored in the control data section 24 of card 18.

Figure 10:
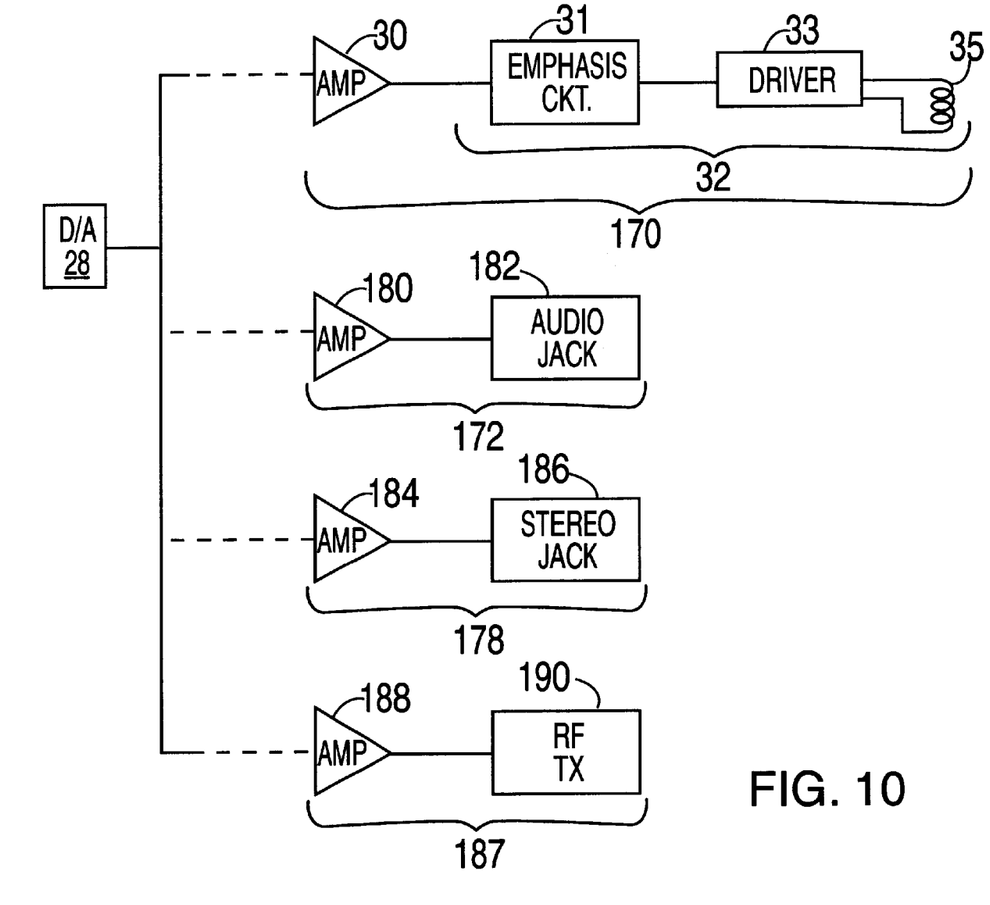
FIG. 10 shows an alternative embodiment with replaceable output modules.

Referring back to FIG. 1, the main embodiment of the invention is shown with the D/A converter feeding a cassette reproducing coil module 170 constructed and arranged to imitate a magnetic analog tape. As shown in FIG. 10, module 170 includes amplifier 30, an emphasis circuit 31, a coil driver 33 and a coil 35. The emphasis circuit 31 emphasizes certain frequency components of the signals in accordance with the standard noise reduction schemes. The purpose of this circuit 31 is to ensure that the sounds from the cassette player 34 are not distorted because of the operation of the de-emphasis circuit 52. The signals from circuit 31 are applied to coil 35 by driver 33.

However, the adapter 10 may be used alone, or in conjunction with other systems as well. For this purpose, module 170 may be removable through panel 86 (FIG. 4) and replaced with another module. Several such modules are shown also in FIG. 10.

For example, module 172 is a headphone module. It consists of an amplifier 180 and a headphone jack 182. When this module 172 is installed, the adapter 10 is a stand alone music player which can be used to play the program on card 18 directly through a pair of earphones (not shown) connected to the jack 176.

Module 178 is a stereo output module. It consists of an amplifier 184 and a standard stereo jack 186. With this module in place, the program on card 18 can be played through a standard stereo system, by connecting the jack 182 to one of the system's external input ports.

Module 187 is an RF module consisting of an amplifier 188 and a RF transmitter 190. In this configuration the adapter is used as a stand-alone transmitter sending the analog signal derived from the card 18 through a radio frequency link, for example to a stereo receiver tuned to a particular frequency.

Figure 11:
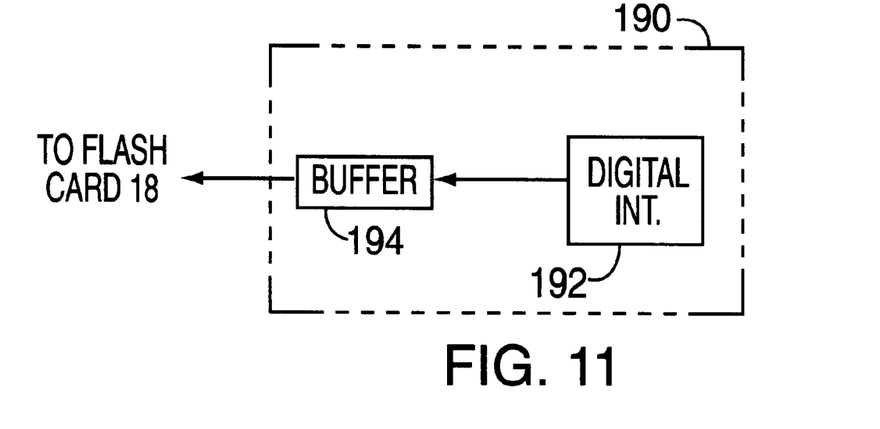
FIG. 11 shows an alternative embodiment with a digital recording module.

Finally the embodiment of FIG. 11 shows a recording module 190 which is preferably adapted to receive audio information in the form of digital data. The data received from the digital interface 192 is stored in a buffer 194 and then loaded to card 18 to be played latter. The digital data may be received from the digital output of a standard system stereo or, from a CD player, and so on. Alternatively, analog data may be received. Within the cassette still it can be sampled and corresponding digital data can be stored in flash memory.

Preferably all these models, generically shown in FIG. 3 as the read/write head 90 are inserted into the housing 70 through panel 84 and mate with appropriate connectors, not shown. In the configurations with modules of FIGS. 10 or 11, the adapter 10 may operate or may or stand alone unit in which mode it does not get coupled to a motor and hence the battery 100 may not be charged.

Although the invention has been described with reference to several preferred embodiments, it is to be understood that these embodiments are merely illustrative of the invention and that the same objectives may be accomplished by other means as well. Accordingly, the embodiments described are to be exemplary, not limiting, with respect to the following claim.

We claim:

1. An adapter for a standard cassette player, said player being arranged to receive a standard cassette with an electromagnetic tape, said player being constructed and arranged to control a movement of said magnetic tape in one of several modes of operation including a play mode in which analog signals from said tape are reproduced as audio signals by said player, fast forward mode in which said tape is moved in a forward direction and reverse in which said tape is moved in a reverse direction, said cassette player including a spindle motor and a spindle coupled to said spindle motor for effecting the movement of said tape, said standard cassette player further including a de-emphasis circuit, said adapter comprising:

an adapter housing constructed and arranged to be received in said player to play a pre-recorded audio program by emulating said standard cassette player and having;

a replaceable digital data storage medium disposed in said housing through said opening, said storage medium holding digital data defining said audio program said audio program being compressed using a standard compression technique, said audio program consisting of at least one predetermined audio section selectable by the operator of said standard cassette player and having a predetermined duration;

a controller for retrieving said digital data from said storage medium in a predetermined order;

a cassette reproducing circuit which converts said digital data into analog signals having characteristics similar to standard analog signals on standard magnetic tapes, said converter including an emphasis circuit for emphasizing frequency components of said analog signals to complement said emphasis circuit; and         a transmitter for transmitting said analog signals to said standard cassette player whereby said standard cassette player generates audio signals corresponding to said analog signals.

2. The adapter of claim 1 further comprising a monitor for sensing a movement of said spindle, said movement being indicative of one of said modes of operation and generating a sensed signal, and wherein said controller receives said sensed signal and controls a retrieval of said data in accordance with said mode of operation.

3. The adapter of claim 1 further comprising a battery for storing power, said power being used by said adapter for said controller, converter and transmitter.

4. The adapter of claim 3 further comprising a battery charger for charging said battery.

5. The adapter of claim 4 wherein said battery charger include a generator coupled to said spindle for generating electrical energy from said spindle, said electrical energy being used to charge said battery.

6. The adapter of claim 5 further comprising a generator controller for controlling said generator.

7. The adapter of claim 5 further comprising a shunt for selectively shunting said generator to mimic an excessive load on said spindle, said excessive load being indicative of an end of said program.

8. The adapter of claim 5 further comprising a brake coupled to said spindle and a brake controller for selectively applying said brake to said spindle to emulate an excessive load on said signal to simulate an end of tape condition.

9. The adapter of claim 8 wherein said brake is an electronic brake.

10. The adapter of claim 8 wherein said brake includes a capstan, a first coil coupled to said capstan, a second coil electromagnetically coupled to said first coil and a brake controller arranged to selectively apply a preselected load to said second coil.

11. The adapter of claim 8 wherein said brake includes rotating reel driven by said spindle, and an electromagnetic brake assembly including a brake shoe and a solenoid selectively applying said brake against said reel.

12. The adapter of claim 1 wherein said replaceable media contains data compressed using an MPEG standard.

13. A stereo system for playing pre-recorded audio programs selected by an operator comprising:

(A) a control section including:

(i) a command section for generating commands; and         (ii) an electrical section including             (a) an input section receiving signals and having an emphasis circuit for emphasizing certain frequency components of said signals:

(b) an amplifier for amplifying said signals; and             (c) a speaker for generating audio signals from the amplified signals; and     (B) a program section including:

(i) a solid state digital data storage media holding a plurality data groups which have been compressed using a standard compression technique, each of said data groups defining one of the audio programs;

(ii) a program section controller retrieving said data groups without mechanical manipulation of said solid state data storage media, said program section including an de-emphasis circuit that de-emphasizes frequency components of said data groups to complement said emphasis circuit; and         (iii) an output section generating output signals for said input section in accordance with said data groups, said output section including an electromagnetic coil adapted to generate analog signals for said input section.

14. The system of claim 13 wherein said output section includes an analog to digital converter for converting said data groups into sequential analog signals and wherein said input section receives said analog signals.

15. The system of claim 13 wherein said command generator generates commands related to the manner of playing said output signals and wherein said program section controller includes a command sensor for sensing said commands.

16. The system of claim 15 wherein said command generator generates commands including a play command for starting said program and a stop command for stopping said program and wherein in response to said play command said program section controller starts retrieving said data groups, and wherein in response to said stop command said program section controller stops retrieving said data groups.

17. The system of claim 16 wherein said data groups are uniquely identified and wherein said program section controller includes a memory for storing information identifying a last group of data played after a stop command so that when a succeeding play command is received, the program section controller resumes retrieving data groups starting with a data groups successive to said last data group.

18. The system of claim 15 wherein said command generator generates a forward command for skipping forward in said program and wherein said program section controller in response to said forward command skips some of said data groups.

19. The system of claim 18 wherein said program section controller includes a pointer which generates sequential addresses, each address identifying a data group, and wherein said pointer skips addresses in response to said forward command.

20. The system of claim 15 wherein said program includes a plurality of program sections and wherein said storage medium includes a table of contents identifying a beginning for each said program section.

21. The system of claim 20 wherein said command generator generates a forward command for skipping forward in said program and wherein said program section controller in response to said forward command skips some of said data groups.

22. The system of claim 21 wherein said pointer skips to the beginning of a next program section in response to said forward command.

23. The system of claim 20 wherein said command generator generates a reverse command for skipping backward on said program and wherein said pointer skips to a previous program section in response to said reverse command.

24. The system of claim 13 wherein said program section controller includes an end detector for detecting an end of said program.

25. The system of claim 24 wherein said program section controller include a standby mode and an operational mode, wherein said program is reproduced in said operational mode, and wherein said program section controller switches to said standby mode when said end of said program is detected.

26. The system of claim 13 wherein said program section is replaceable with another program section having data groups defining a different program.

27. The system of claim 13 wherein said program section includes a housing with an opening and wherein said solid state data storage medium is replaceable through said opening.

28. The system of claim 13 wherein said program section further includes a decompressing circuit that decompresses the compressed data from said media.

29. A stereo system for playing pre-recorded audio programs selected by the operator of the system, comprising:
   (A) a control section including:
      (i) a command section for generating commands; and
      (ii) an electrical section including
         (a) an input section receiving signals including an emphasis circuit adapted to emphasize certain frequency components of said signals;
         (b) an amplifier for amplifying said signals; and
         (c) a speaker for generating audio signals from the amplified signals; and
      (iii) a mechanical section including:
         (a) a spindle;
         (b) a capstan; and
         (c) motors for driving said spindle and capstan;
   wherein said spindle is arranged and constructed to engage a reel of a standard audio cassette; and
   wherein said capstan is arranged to engage a magnetic tape in said standard audio cassette; and
   (B) a cassette constructed and arranged to store a pre-recorded audio program selected by the operator, said cassette having a housing including:
      (i) a solid state digital data storage media holding a plurality data groups, each of said data groups defining one of said audio programs and being compressed in accordance with a standard compression technique;
      (ii) a cassette controller retrieving said data groups without mechanical manipulation of said solid state data storage media, said cassette controller including a cassette tape reproducing circuit arranged to generate analog signals having characteristics which imitate the characteristics of standard analog signals on a magnetic tape, said tape reproducing circuit including a de-emphasis circuit for de-emphasizing frequency components of said data groups to complement the operation of said emphasis circuit; and
      (iii) an output section generating output signals for said input section in accordance with said data groups, said output signals having the same characteristics as the analog signals from said magnetic tape.

30. The system of claim 29 wherein said cassette housing further includes a reel rotatably engaging said spindle.

31. The system of claim 30 wherein said controller generates said commands to change a movement of said spindle motor, and wherein said cassette housing further includes a sensor for sensing a motion of said reel and a command detector for detecting a command as indicated by said motion of said reel.

32. The system of claim 31 wherein said cassette controller receives said command and adjusts the retrieval of said data groups in accordance with said command.

33. The system of claim 32 wherein said command is selected from a forward and a reverse command.

34. The system of claim 33 further comprising a detector for detecting a total length of said program, a speed sensor for sensing a speed of said reel and an index generator for generating an index related to said length and said speed.

35. The system of claim 34 wherein said cassette controller skips some data groups following said forward command in accordance with said index.

36. The system of claim 34 wherein said cassette controller skips some data groups preceding said reverse command in accordance with said index.

37. The system of claim 34 wherein said cassette housing includes a selector for selecting a first mode and a second mode of operation.

38. The system of claim 37 wherein said command has a command duration and wherein in said first mode said cassette controller skips a number of data groups in response to said command, said number being dependent on said command duration.

39. The system of claim 34 wherein said program is partitioned into several program selections and wherein in said second mode said cassette controller skips to a next program selection in response to said forward command.

40. The system of claim 29 further comprising a battery to provide energy to said cassette housing and a battery charger for charging said battery.

41. The system of claim 40 wherein said battery charger is coupled to said spindle to derive energy from said spindle motor.

42. The system of claim 41 further comprising an end sensor for sensing an end of said program.

43. The system of claim 42 further comprising a brake and a brake activator for applying said brake on said spindle when said end program is detected.

44. The system of claim 43 wherein said brake includes an electrical element for applying an electromagnetic force on said spindle.

45. The system of claim 43 wherein said brake include a mechanical shoe.

46. A cassette system comprising:
   a housing shaped to emulate a standard audio cassette and arranged and constructed to fit removably into a standard audio system;
   a solid state data storage device holding data groups defining a pre-recorded audio program, data groups being compressed in accordance with a standard data compression scheme;
   a controller disposed in said housing for retrieving said data from said storage device and generating corresponding output signals having characteristics similar to standard signals on a magnetic tape including de-emphasized frequency components, said controllers including a de-emphasis circuit for de-emphasizing digital data to simulate said de-emphasized frequency components; and an output device receiving said output signals and transmitting said output signals to an external device for reproduction as audio signals.

47. The system of claim 46 wherein said output device includes a single module selected from the group consisting of an analog module, an audio module, a stereo module and an rf module, wherein said analog module outputs analog signals similar to signals from a standard magnetic tape cassette; said audio jack generates audio signals compatible with a headphone; said stereo module generates stereo signals compatible with a stereo amplifier and said rf module transmits said output signals in an rf range.

48. The system of claim 46 further comprising a recorder for recording audio signals in said storage device, and an input module for receiving said audio signals.

49. A cassette system comprising:

a housing arranged and constructed to fit removably into a standard audio system, said housing including at least one hole for receiving a capstan drive from the standard audio system, said capstan drive being arranged to drive a standard analog cassette with a magnetic tape;

a solid state data storage device holding data groups defining an audio program;

a controller disposed in said housing and coupled to said capstan drive for retrieving said data from said storage device and generating corresponding output signals;

an output device receiving said output signals and transmitting said output signals to an external device for reproduction as audio signals in a manner which imitates signals from said magnetic tape;

a reel disposed in said housing adjacent to said hole and adapted to receive said capstan drive, and a sensor coupled to said controller and arranged to monitor a rotation of said reel; and a clutch disposed in said housing and arranged to respond to commands from said controller and to apply a torque to said reel to imitate an end of tape condition.

50. The system of claim 49 wherein said clutch is an electric clutch.

51. The system of claim 49 wherein said clutch is a mechanical clutch.

52. A cassette system comprising:

a housing arranged and constructed to fit removably into a standard audio system, said housing including at least one hole for receiving a capstan drive from the standard audio system, said capstan drive being arranged to drive a standard analog cassette with a magnetic tape;

a replaceable solid state data storage device holding data groups defining an audio program;

a controller disposed in said housing and coupled to said capstan drive for retrieving said data from said storage device and generating corresponding output signals;

an output device receiving said output signals and transmitting said output signals to an external device for reproduction as audio signals in a manner which imitates signals from said magnetic tape; and an electric generator disposed in said housing to provide power to the cassette system, said electric generator being driven by said capstan.

53. The system of claim 52 further comprising a battery storing energy and providing power to said system, said generator being arranged to charge said battery.

54. The system of claim 52 wherein said solids state data storage device contains digital data defining musical works of predetermined durations.

\* \* \* \* \*